April 25, 1967 R. R. BROOKS 3,316,497

PHASE CONTROLLED OSCILLATOR LOOP WITH VARIABLE PASSBAND FILTER

Filed July 9, 1965 2 Sheets-Sheet 1

INVENTOR.
ROBERT R. BROOKS
BY Howard J. Murray, Jr. AGENT
R. Baxter Warner
ATTORNEY April 25, 1967 R. R. BROOKS 3,316,497
PHASE CONTROLLED OSCILLATOR LOOP WITH VARIABLE PASSBAND FILTER
Filed July 9, 1965 2 Sheets-Sheet 2

INVENTOR.
ROBERT R. BROOKS
BY [signature] AGENT
[signature] ATTORNEY

United States Patent Office 3,316,497
Patented Apr. 25, 1967

3,316,497

PHASE CONTROLLED OSCILLATOR LOOP WITH VARIABLE PASSBAND FILTER

Robert R. Brooks, Willingboro, N.J., assignor, by mesne assignments, to the United States of America as represented by the Secretary of the Navy

Filed July 9, 1965, Ser. No. 470,945
1 Claim. (Cl. 331—17)

The present invention relates to electrical networks, and more particularly to oscillatory circuits of the phase-controlled type.

When oscillators are employed for frequency synthesis, it is desirable that the reference signal possess a high degree of purity—that is, freedom from spurious noise impulses. In addition, when the reference signal changes from one frequency to another, the oscillator should "lock-on" to the new frequency in as short a period of time as possible. However, these two requirements are not normally compatible with one another in the sense that maximum freedom from noise implies a narrow input signal bandwidth, while fast "pull-in" of the oscillator necessitates a wide "search region" in order that the reference or error signal be encompassed within the acquisition capabilities of the network. Expressed differently, the circuit should be designed to possess a narrow (noise-free) bandwidth during oscillator synchronism and a wider passband (or high gain) during the asynchronous mode. Although this problem has been recognized and several solutions heretofore proposed, they have not proven to be entirely satisfactory.

According to a feature of the present invention, a resistance-capacitance network is provided which acts as a filter having a predetermined frequency passband under certain input conditions. This filter is connected in the control loop of the oscillator the operation of which is to be governed. The filter is so designed, however, that the resistance factor thereof varies in response to changes in the input conditions—in this case, the amplitude of the reference or error signal. Consequently, when the oscillator is synchronized and the error voltage is small, the filter possesses a narrow passband and a low noise factor. As the oscillator approaches an asynchronous condition, the error signal increases in amplitude, but would normally lie near the boundaries of the filter passband which prevails during the synchronized state and hence be relatively ineffective. Due to the action of the variable-resistance components of applicant's novel network, however, the frequency spread of the filter is extended outwardly during this period to encompass the error signal, and as a result a quick oscillator "lock-on" is achieved. The time required for synchronization when applicant's arrangement is employed is consequently considerably shorter than is the case where the passband of the filter is narrow during the search mode.

One object of the present invention, therefore, is to provide improved means for synchronizing a phase-controlled oscillator.

Another object of the invention is to provide a network for ensuring synchronization of a phase-controlled oscillator over a wide range of error signal amplitudes.

A further object of the invention is to provide a synchronizing circuit for an oscillator, such circuit including a filter network having a frequency passband which varies as a direct function of changes in the amplitude of the developed error voltage.

Other objects, advantages, and novel features of the invention will become apparent from the following detailed description of the invention when considered in conjunction with the accompanying drawings wherein.

Figure 1:
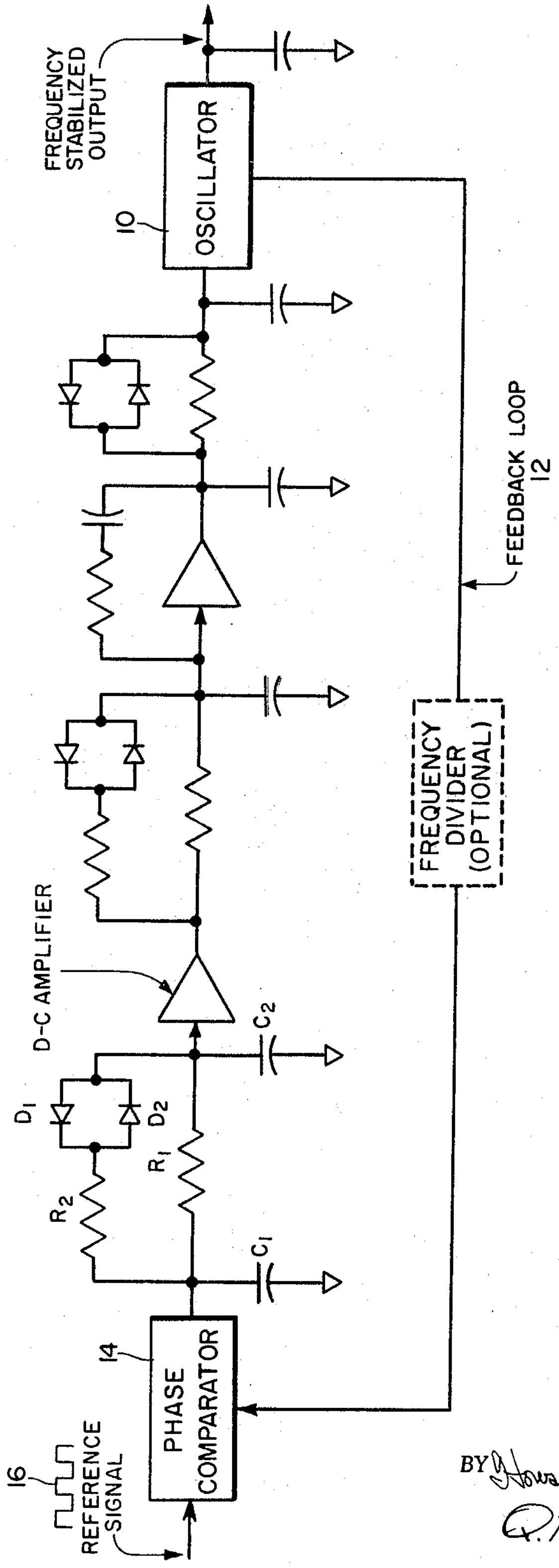
FIG. 1 is a schematic diagram of a preferred form of synchronizing network incorporating the principles of the present invention.

Referring now to the drawings, FIG. 1 sets forth a phase-locked loop which incorporates a non-linear filter network designed in accordance with the present concept. Although the showing of FIG. 1 includes several such filter networks connected in cascaded relation, the operation of each unit is substantially identical to that of the others and hence a description of a single assembly will suffice to explain the manner in which the desired results are achieved.

A variable frequency phase-controlled oscillator 10 is arranged in a phase-locked loop circuit of more or less standard design in that the output of the oscillator is fed back by means of a conductor 12 to a phase comparator 14 to which is also applied a cyclically-recurring reference signal 16. The unit 14 compares the phase of these two signals to develop an error voltage output in the usual manner, this error signal being applied through a series of filters to the oscillator 10 to regulate its frequency of operation. A frequency divider 18 may optionally be utilized if desired.

Although filters are conventionally employed in arrangements of this type to attenuate the ripple caused by the phase detector 14, they have generally consisted of a series resistor $R_1$ and a pair of shunt capacitors $C_1$ and $C_2$. Both the gain and bandwidth of the filter are a function of $R_1$, since as the latter decreases both the gain and the bandwidth increase. During an asynchronous condition of the oscillator 10, the error signal not only shifts in frequency with respect to its value during "lock-on," but also materially increases in amplitude. If the resistor $R_1$ could "sense" the presence of this larger error signal and decrease or reduce in value, then both the gain and bandwidth of the filter would increase as long as such error signal was present. This would improve the ability of the oscillator to lock-on to the reference or input signal with minimum delay. However, such operation must be carried out without any detrimental effect on the noise bandwidth of the filter during the *synchronous* mode.

The circuit of FIG. 1 is designed to take advantage of the high forward resistance of a diode at low current levels and its high forward conductance at a larger current level. As shown in the drawing, a second resistor $R_2$ is connected in series with a pair of diodes $D_1$ and $D_2$, this series combination being shunted across the filter resistor $R_1$.

Figure 3:
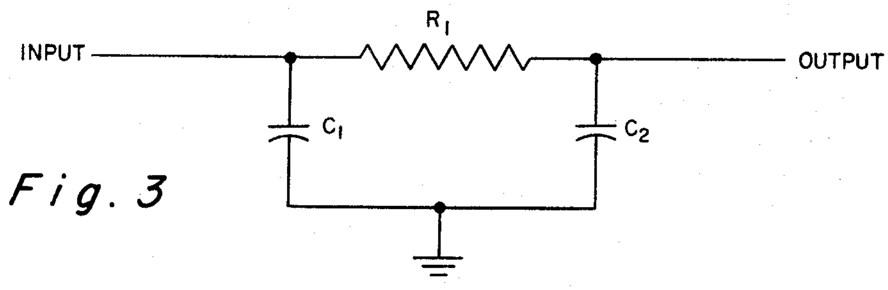
FIG. 3 is a schematic showing of a portion of the circuit of FIG. 1, serving to aid in illustrating the principles upon which the present invention is based.
Figure 2:
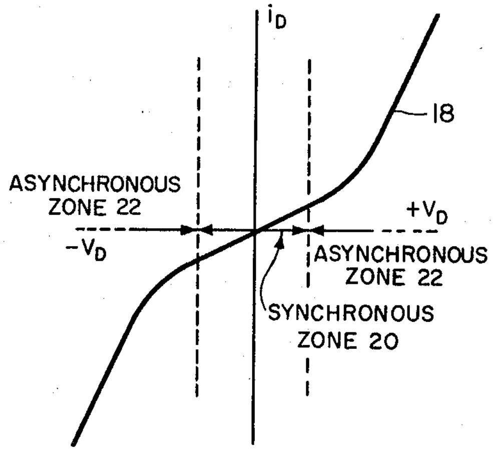
FIG. 2 is a composite characteristic curve of the two associated semi-conducting devices incorporated in one portion of the network of FIG. 1.

Reference to FIG. 2 will bring out the current-voltage relationships of the diodes $D_1$ and $D_2$ considered as a unit, the curve 18 being a composite one for both positive and negative input potentials. From this curve it will be apparent that at low error signal amplitudes at the input to the filter during the synchronous phase 20 of oscillator operation both $D_1$ and $D_2$ will conduct only slightly, and the *effective* filter circuit will become essentially as shown in FIG. 3.

Figure 4:
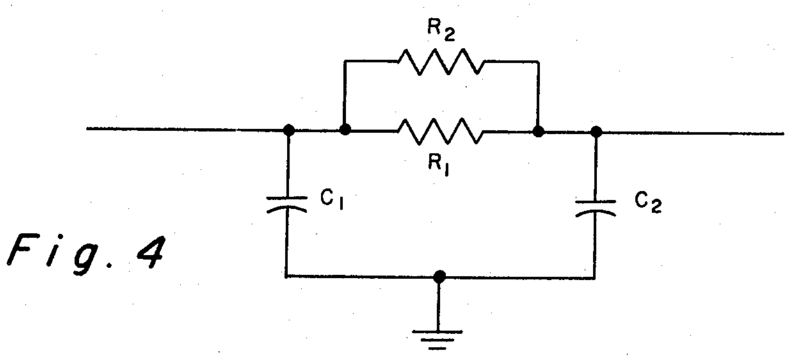
FIG. 4 is a modification of the circuit portion of FIG. 3 produced during operation of the network of FIG. 1 under certain conditions.

However, as the error signal amplitude increases within the asynchronous zone 22, the diode unit $D_1$–$D_2$ will become much more conductive to effectively place a low resistance $R_2$ in shunt with the filter resistance $R_1$. In other words, the filter circuit becomes as shown in FIG. 4. As previously brought out, this reduction in the effective value of $R_1$ increases the cut-off frequency of the filter. Such action, however, continues *only* as long as the error signal continues to be of high amplitude, and upon return of the oscillator 10 to synchronism, the consequent reduction of error signal amplitude brings the filter back to its original condition as represented by FIG. 3 along with a narrow bandwidth characteristic.

Although the boundary between the two zones is indicated as being sharp in FIG. 2 for ease of illustration, the transition between the synchronous and asynchronous states is not sharp but is instead gradual. It can be adjusted to a desired point by a proper choice of circuit parameters in order to satisfy all operating requirements.

Figure 5:
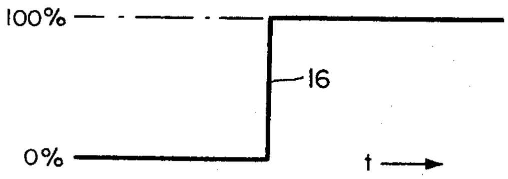
FIG. 5 is a portion of a waveform such as might be applied as an input or reference signal to the network of FIG. 1.

It has been mentioned that applicant's network as herein described reduces the acquisition time of the circuit during the oscillator search mode. This aspect of the disclosure is brought out by FIGS. 5 and 6. The former illustrating a portion of a regularly-recurring input voltage such as the square-wave identified by the reference numeral 16 in FIG. 1. Ideally, the leading and trailing edges of each cycle thereof should be essentially vertical, or in other words, the time required for the voltage to reach full value from zero should be negligible.

Figure 6:
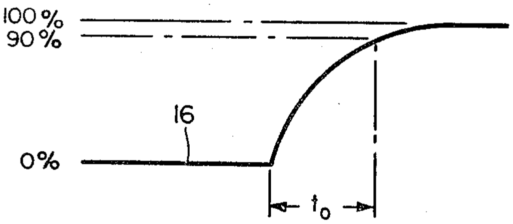
FIG. 6 is a showing of how the waveform of FIG. 5 is modified in its configuration due to passage through the network of FIG. 1.

However, because of the time constants in the circuit, the output wave will instead have a form such as shown in FIG. 6. The rise time $t_o$ required for the voltage to reach 90% of full value depends on the bandwidth of the circuit, and it is known in the art that the product of rise time and bandwidth is a constant. It therefore follows that when the bandwidth of the filter network is increased in the manner brought out above, the rise time $t_o$ becomes less and the voltage reaches a given amplitude sooner than is the case in conventional arrangements. Summarizing, the greater the bandwidth, the shorter the rise time, and the shorter the rise time, the faster will be the response of the circuit.

Obviously many modifications and variations of the present invention are possible in the light of the above teachings. It is therefore to be understood that within the scope of the appended claim the invention may be practiced otherwise than as specifically described.

I claim:

In a system for maintaining synchronism between an oscillator and a cyclically-recurring input variation under conditions where a rapid "pull-in" of the oscillator is desired following a change in the recurrence frequency of the input variation, as well as maximum freedom from the deleterious effects of noise impulses during periods of oscillator synchronization, the combination of:

a phase comparator adapted to receive said input variation;

a feedback loop connecting said oscillator to said phase comparator, the latter acting to develop an error signal the magnitude of which is dependent upon the phase difference between said input variation and the output wave from said oscillator;

a filter network having a non-linear input vs. output characteristic over an error signal range that encompasses both synchronous and asynchronous modes of oscillator operation;

said filter network including a series resistor and at least one shunt capacitor, the resistance-capacitance relationship thereof being determinative of the frequency passband possessed by said network;

means connecting said phase comparator to said oscillator through said filter network, the latter having a predetermined frequency passband during periods when said oscillator is synchronized with said input variation; and means for modifying the bandwidth of said filter network during periods when said oscillator is out of synchronism with said input variation;

said means for modifying the bandwidth of said filter network during periods when said oscillator is out of synchronism with said input variation including an impedance unit connected in parallel relationship with the said series resistor of said network, said impedance unit having a non-linear voltage vs. current characteristic;

said impedance unit comprising a resistor in series with the parallel combination of two diodes connected with opposed polarities insofar as the passage of said error signal through said filter network is concerned;

such that the frequency passband of said filter network is modified, during periods when said oscillator is out of synchronism with said reference signal, by an amount which is a non-linear function of the amplitude of the error signal output of said phase comparator.

References Cited by the Examiner

UNITED STATES PATENTS

| | | | |
|---|---|---|---|
| 2,617,037 | 11/1952 | Hugenholtz | 331—17 X |
| 2,676,262 | 4/1954 | Hugenholtz | 331—17 X |

FOREIGN PATENTS

| | | |
|---|---|---|
| 826,171 | 12/1951 | Germany. |

ROY LAKE, *Primary Examiner.*

S. H. GRIMM, *Assistant Examiner.*